United States Patent
Kikuchi et al.

(10) Patent No.: US 9,966,441 B2
(45) Date of Patent: May 8, 2018

(54) SEMICONDUCTOR DEVICE WITH TWO-DIMENSIONAL ELECTRON GAS

(71) Applicant: Kabushiki Kaisha Toshiba, Minato-ku (JP)

(72) Inventors: Takuo Kikuchi, Kamakura (JP);
Yoshiro Baba, Yokohama (JP);
Masahiko Yamamoto, Kanazawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days. days.

(21) Appl. No.: 15/259,445

(22) Filed: Sep. 8, 2016

(65) Prior Publication Data
US 2017/0084704 A1 Mar. 23, 2017

(30) Foreign Application Priority Data
Sep. 18, 2015 (JP) .................. 2015-185007

(51) Int. Cl.
*H01L 29/40* (2006.01)
*H01L 29/778* (2006.01)
(Continued)

(52) U.S. Cl.
CPC .......... *H01L 29/402* (2013.01); *H01L 29/405* (2013.01); *H01L 29/66462* (2013.01);
(Continued)

(58) Field of Classification Search
CPC ......... H01L 29/66462; H01L 29/66431; H01L 29/778–29/7789; H01L 2924/13064;
(Continued)

(56) References Cited

U.S. PATENT DOCUMENTS 6,903,383 B2 * 6/2005 Yokogawa .......... H01L 21/8252
257/192
8,384,130 B2 * 2/2013 Jeon ...................... H01L 29/404
257/194
(Continued)

FOREIGN PATENT DOCUMENTS

JP 2008-210934 9/2008
JP 2009-253126 10/2009

*Primary Examiner* — Jose R Diaz
(74) *Attorney, Agent, or Firm* — Oblon, McClelland, Maier & Neustadt, L.L.P.

(57) ABSTRACT

A semiconductor device, including a first nitride semiconductor layer, a second nitride semiconductor layer provided on the first nitride semiconductor layer and having a band gap width larger than or equal to a band gap width of the first nitride semiconductor layer, first, second, and third electrodes provided on the second nitride semiconductor layer, an insulation layer provided on the second nitride semiconductor layer and between the first and second electrodes, and a conductor provided within the insulation layer between the second and third electrodes and connecting the second and third electrodes to each other, or the conductor provided within the insulation layer between the first and second electrodes and connecting the first and second electrodes to each other, the conductor including a plurality of conductive regions arranged in a first direction from the first electrode toward the second electrode, the conductive regions being electrically connected to one another.

14 Claims, 13 Drawing Sheets

(51) Int. Cl.
*H01L 29/66* (2006.01)
*H01L 29/20* (2006.01)
*H01L 29/423* (2006.01)

(52) U.S. Cl.
CPC ...... *H01L 29/7787* (2013.01); *H01L 29/2003* (2013.01); *H01L 29/42376* (2013.01)

(58) Field of Classification Search
CPC ... H01L 2924/1206; H01L 2924/19042; H01L 2924/19043; H01L 2924/1207; H01L 28/10; H01L 28/20; H01L 28/24; H01L 27/02888; H01L 29/402; H01L 29/405
See application file for complete search history.

(56) References Cited

U.S. PATENT DOCUMENTS

| | | | |
|---|---|---|---|
| 9,082,693 B2 * | 7/2015 | Jeon | H01L 29/205 |
| 9,130,478 B2 * | 9/2015 | Feldtkeller | H02M 7/5387 |

* cited by examiner

SEMICONDUCTOR DEVICE WITH TWO-DIMENSIONAL ELECTRON GAS

CROSS REFERENCE TO RELATED APPLICATION

This application is based upon and claims the benefit of priority from prior Japanese Patent Application No. 2015-185007, filed on Sep. 18, 2015, the entire contents of which are incorporated herein by reference.

BACKGROUND

Exemplary embodiments described herein generally relate to a semiconductor device.

Semiconductor devices such as High Electron Mobility Transistor (HEMT) have been developed as a power device having higher breakdown voltage and lower power loss. When a high voltage is applied between a source electrode and a drain electrode in the HEMT, electrons in two-dimensional electron gas (2DEG) are trapped at the interface between a semiconductor layer and a gate insulation film, or within the gate insulation film, because of electric field concentration at an end of the drain electrode in the source-electrode side, for example.

The electric field generated by the trapped electrons depletes the 2DEG in a channel region, increasing on-state resistance between the source electrode and the drain electrode.

DETAILED DESCRIPTION

Figure 1A:
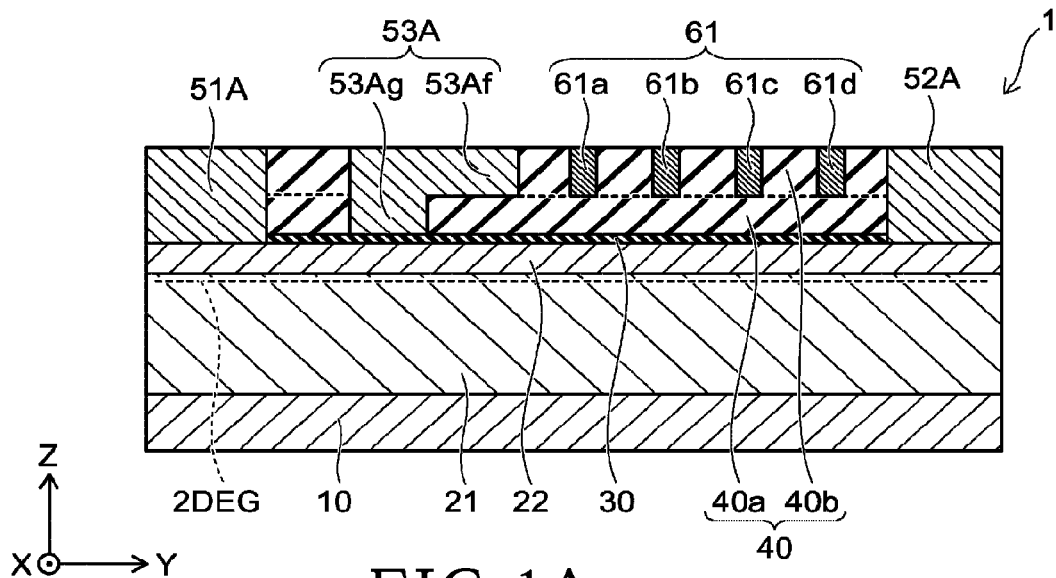
FIG. 1A and FIG. 1B are a schematic cross-sectional view and a schematic top view of a semiconductor device according to a first embodiment, respectively.

An aspect of one embodiment, there is provided a semiconductor device, including a first nitride semiconductor layer, a second nitride semiconductor layer provided on the first nitride semiconductor layer, the second nitride semiconductor layer having a band gap width larger than or equal to a band gap width of the first nitride semiconductor layer, a first electrode provided on the second nitride semiconductor layer, a second electrode provided on the second nitride semiconductor layer, a third electrode provided on the second nitride semiconductor layer and between the first electrode and the second electrode, an insulation layer provided on the second nitride semiconductor layer and between the first electrode and the second electrode, and a conductor provided within the insulation layer between the second electrode and the third electrode and connecting the second electrode and the third electrode to each other, or the conductor provided within the insulation layer between the first electrode and the second electrode and connecting the first electrode and the second electrode to each other, the conductor including a plurality of conductive regions arranged in a first direction which is a direction from the first electrode toward the second electrode, the conductive regions being electrically connected to one another.

First Embodiment

Hereinafter, the embodiments are described referring to the drawings.

In the descriptions below, the same portions are denoted by the same reference signs, and descriptions for the portions that have been already described are appropriately omitted. Some of the drawings are depicted based on XYZ coordinates.

Figure 1B:
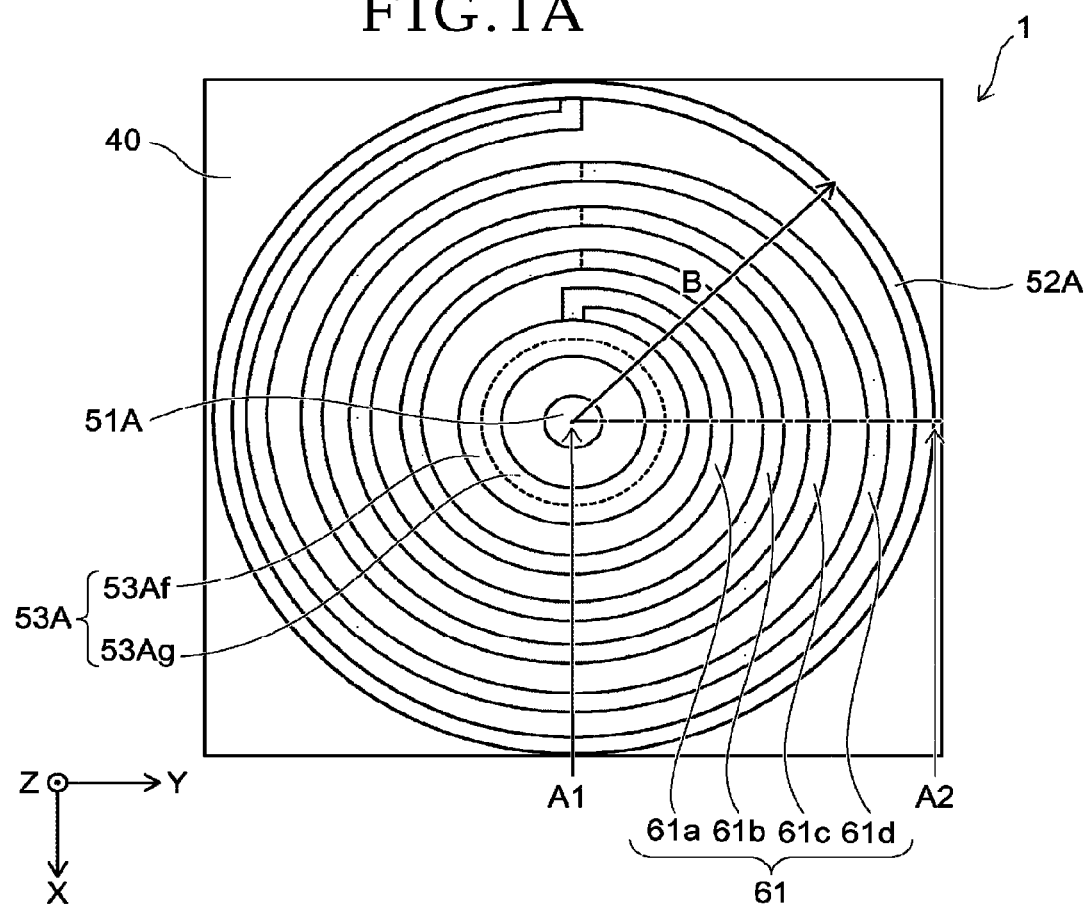

FIG. 1A is a schematic cross-sectional view of a semiconductor device according to a first embodiment. FIG. 1B is a schematic top view of the semiconductor device according to the first embodiment. FIG. 1A illustrates the cross section taken along line A1-A2 of FIG. 1B.

The semiconductor device 1 according to the first embodiment includes a substrate 10, a first nitride semiconductor layer (hereinafter referred to as a first semiconductor layer 21, for example), a second nitride semiconductor layer (hereinafter referred to as a second semiconductor layer 22, for example), a gate insulation film 30, a first electrode 51A, a second electrode 52A, a third electrode 53A, an insulation layer 40, and a conductor 61. The semiconductor device 1 is, for example, a normally-on HEMT.

The substrate 10 includes silicon (Si), for example. The substrate 10 is not limited to the silicon substrate, but may be a sapphire substrate, a diamond substrate, a silicon carbide substrate, a carbon substrate, a nitride semiconductor substrate, a boron nitride substrate, a germanium substrate, or the like.

The first semiconductor layer 21 is provided on the substrate 10. The first semiconductor layer 21 is a carrier layer of the HEMT. The first semiconductor layer 21 includes $Al_XGa_{1-X}N$ $(0 \leq X \leq 1)$.

The first semiconductor layer 21 includes, for example, non-doped aluminum gallium nitride ($Al_XGa_{1-X}N$ $(0 \leq X \leq 1)$). The first semiconductor layer 21 can include any of $Ga_xIn_{1-x}N_yAs_{1-y}$ $(0 \leq x \leq 1, 0 \leq y \leq 1)$, $Al_xIn_yGa_{1-x-y}N$ $(0 \leq x \leq 1,$ $0 \leq y \leq 1$), and $B_xIn_{1-x}N$ ($0 \leq x \leq 1$). A buffer layer can be provided between the substrate 10 and the first semiconductor layer 21.

The second semiconductor layer 22 is provided on the first semiconductor layer 21. The second semiconductor layer 22 is a barrier layer in the HEMT. The second semiconductor layer 22 includes $Al_yGa_{1-y}N$ ($0 \leq Y \leq 1$, $X<Y$). The second semiconductor layer 22 has a band gap width larger than or equal to that of the first semiconductor layer 21.

The second semiconductor layer 22 includes, for example, non-doped or n-type aluminum gallium nitride ($Al_yGa_{1-y}N$ ($0 \leq Y \leq 1$, $X<Y$)). The second semiconductor layer 22 can include any of $Ga_xIn_{1-x}N_yAs_{1-y}$ ($0 \leq x \leq 1$, $0 \leq y \leq 1$), $Al_xIn_yGa_{1-x-y}N$ ($0 \leq x \leq 1$, $0 \leq y \leq 1$), and $B_xIn_{1-x}N$ ($0 \leq x \leq 1$). Inside the first semiconductor layer 21, two-dimensional electron gas (2DEG) is generated around the interface between the first semiconductor layer 21 and the second semiconductor layer 22.

The gate insulation film 30 is provided on the second semiconductor layer 22. The gate insulation film 30 includes any of silicon nitride ($Si_3N_4$), silicon oxide ($SiO_2$), and aluminum oxide ($Al_2O_3$).

The first electrode 51A is provided on the second semiconductor layer 22. The first electrode 51A is a source electrode of the HEMT. The first electrode 51A is in ohmic contact with the second semiconductor layer 22.

The second electrode 52A is provided on the second semiconductor layer 22. The second electrode 52A is a drain electrode in the HEMT. The second electrode 52A is in ohmic contact with the second semiconductor layer 22.

The third electrode 53A is provided on the second semiconductor layer 22 with the gate insulation film 30 in between. The third electrode 53A includes a gate electrode 53Ag and a gate field plate electrode 53Af in the HEMT. The third electrode 53A is provided between the first electrode 51A and the second electrode 52A. The distance between the gate field plate electrode 53Af and the second electrode 52A is shorter than the distance between the gate electrode 53Ag and the second electrode 52A.

The outer shapes of the first electrode 51A, the second electrode 52A, and the third electrode 53A in the XY plane are, for example, circular shapes (FIG. 1B).

The first electrode 51A, the second electrode 52A, or third electrode 53A includes at least any of Pt, Ni, Pd, Au, W, Cr, Nb, Ta, Mg, Ti, Al, Cu, and poly-crystalline silicon.

The insulation layer 40 is provided on the second semiconductor layer 22. The insulation layer 40 is a protective layer in the HEMT. The insulation layer 40 is provided between the first electrode 51A and the second electrode 52A. The insulation layer 40 is provided, for example, between the first electrode 51A and the third electrode 53A as well as between the third electrode 53A and the second electrode 52A.

The insulation layer 40 includes an insulation layer 40a provided on the side of the second semiconductor layer 22 and an insulation layer 40b provided on the insulation layer 40a. The gate field plate electrode 53Af is provided on the insulation layer 40a. In other words, a portion of the insulation layer 40a is provided between the gate field plate electrode 53Af and the gate insulation film 30 in the Z direction. When the insulation layer 40a and the insulation layer 40b are made of the same material, a boundary between the insulation layer 40a and the insulation layer 40b is almost not formed. The insulation layer 40 includes, for example, silicon nitride.

The conductor 61 is provided between the second electrode 52A and the third electrode 53A. The conductor 61 is positioned between the second electrode 52A and the third electrode 53A. The conductor electrically connects the second electrode 52A and the third electrode 53A to each other. The conductor 61 includes conductive oxide film such as indium tin oxide (ITO) or poly-crystalline silicon.

The conductor 61 includes a plurality of conductive regions 61a, 61b, 61c, and 61d. The conductive regions 61a to 61d are arranged in a first direction (the arrow B indicated in the FIG. 1B, for example) from the first electrode 51A toward the second electrode 52A. Specifically, the conductive regions 61a to 61d are not in contact with one another in the direction of the arrow B. However, the conductive regions 61a to 61d are electrically connected to one another (FIG. 1B).

The conductive regions 61a to 61d are connected to one another in series, for example. The length of the conductor 61 is longer than the distance between the second electrode 52A and the third electrode 53A. The total length of the conductive regions 61a to 61d connected in series, in other word, the total of the lengths of the conductive regions 61a to 61d is longer than the distance between the second electrode 52A and the third electrode 53A.

The first electrode 51A is surrounded by the third electrode 53A. The third electrode 53A is surrounded by the second electrode 52A. The third electrode 53A is surrounded by the conductive regions 61a to 61d. The conductive region 61a is surrounded by the conductive region 61b. The conductive region 61b is surrounded by the conductive region 61c. The conductive region 61c is surrounded by the conductive region 61d. The conductive regions 61a to 61d connected in series are arranged above the second semiconductor layer 22 in a spiral fashion.

In the embodiment, the number of the conductive regions, each width of the conductive regions, and each interval between the conductive regions are not limited to the example illustrated in the drawings.

Characteristics of the semiconductor device 1 according to this embodiment are described. The characteristics to be described below are examples of the characteristics of the semiconductor device 1.

Figure 2A:
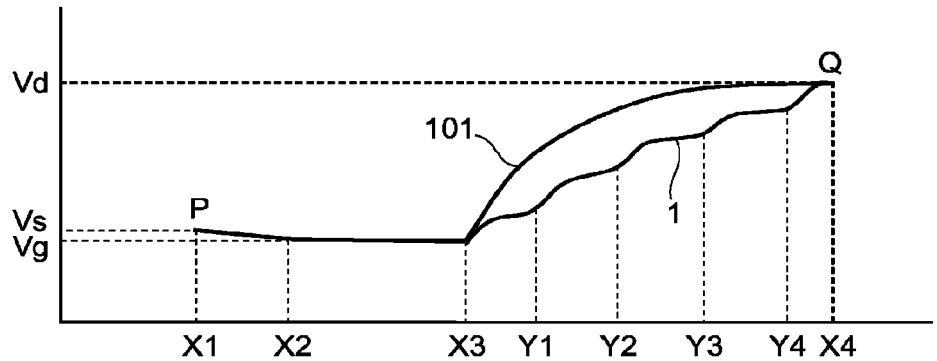
FIGS. 2A, 2B, and 2C are a graph illustrating characteristics of the semiconductor device according to the first embodiment, a schematic cross-sectional view illustrating characteristics of a semiconductor device according to a first reference, and a schematic cross-sectional view illustrating the characteristics of the semiconductor device according to the first embodiment, respectively.
Figure 2B:
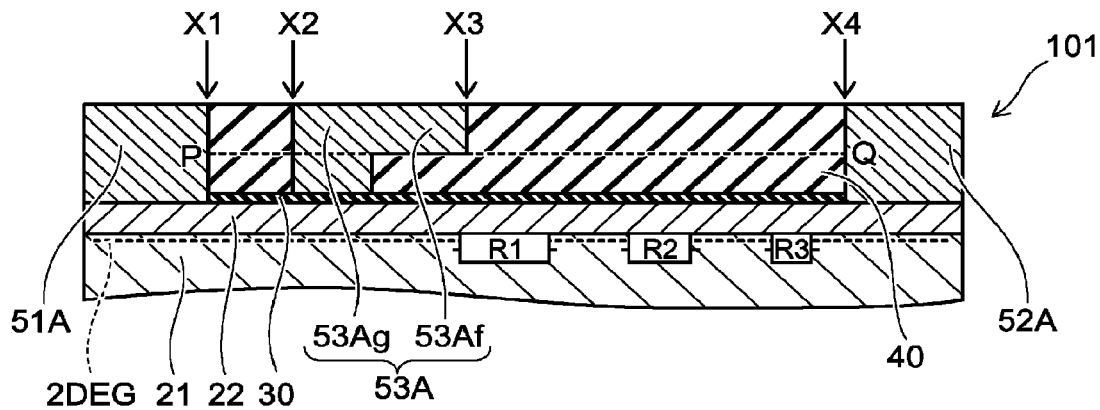
Figure 2C:
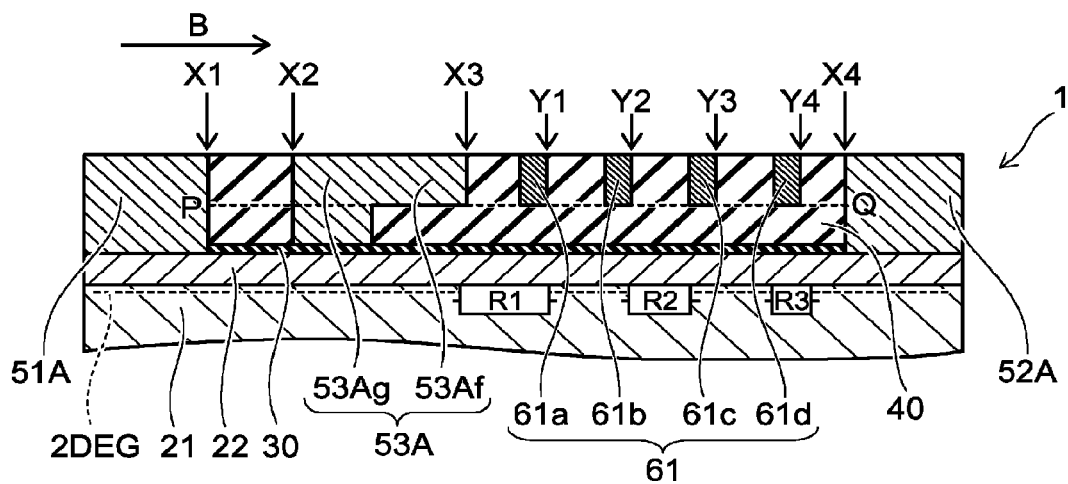

FIG. 2A is a graph illustrating the operation of the semiconductor device according to the first embodiment. FIG. 2B is a cross-sectional view illustrating characteristics of a semiconductor device according to a first reference. FIG. 2C is a schematic cross-sectional view illustrating the characteristics of the semiconductor device according to the first embodiment.

In FIG. 2A, X1 illustrated on the horizontal axis indicates the end position of the first electrode 51A (source) in the side of the second electrode 52A (drain). X2 indicates the end position of the third electrode 53A (gate) in the side of the first electrode 51A (source). X3 indicates the end position of the third electrode 53A (gate) in the side of the second electrode 52A (drain). X4 indicates the end position of the second electrode 52A (drain) in the side of the third electrode 53A (gate). Y1 to Y4 indicate the end positions of the conductive regions 61a to 61d in the side of the second electrode 52A (drain). The vertical axis represents voltage (V).

In FIG. 2C, a line P-Q extending from an end of the first electrode 51A to an end of the second electrode 52A is positioned at the lower end of the conductor 61 (the conductive regions 61a to 61d). In FIG. 2B, a line P-Q is also drawn at the same position as in FIG. 2C.

When a high voltage is applied between the source electrode and the drain electrode of the HEMT, electrons in the 2DEG are trapped by the interface states existing at the interface between the barrier layer and the gate insulation film, or defects existing in the gate insulation film and the protective film, because of electric field concentration at an end of the drain electrode, for example. The electric field generated by the trapped electrons depletes the 2DEG in the channel region, increasing on-state resistance between the source electrode and the drain electrode. This phenomenon is called current collapse. When the electrostatic potential of the protective film is increased, the current collapse is more likely to be occurred.

In a semiconductor device 101 illustrated in FIG. 2B, a conductor 61 (conductive regions 61a to 61d) is not provided between a third electrode 53A and a second electrode 52A, for example. In the semiconductor device 101, portions for the conductor 61 are filled with an insulation layer 40. The semiconductor device 101 is a normally-on HEMT.

Here, a voltage Vd which is higher than a voltage Vs of the first electrode 51A, is applied to the second electrode 52A, such that the semiconductor devices 1 and 101 are put in off state. This state is called a stress state in the embodiment. Vs is set to 0 V, and Vd is set, for example, around 500 V. A voltage Vg is applied to the third electrode 53A, the potential Vg being lower than the voltage Vs of the first electrode 51A. Vg is, for example, set from −10 V to −20 V. This phenomenon is attributed that the semiconductor devices 1 and 101 are normally-on HEMTs, and thus are put in the off state with application of a negative voltage to the third electrode 53A.

Immediately after the semiconductor devices 1 and 101 are put in the stress state, a depletion layer in the channel region extends from the side of the first electrode 51A toward the side of the second electrode 52A. This phenomenon makes the resistance of the channel region in the side of the first electrode 51A is higher than that in the side of the second electrode 52A.

In FIGS. 2B and 2C, three positions are arbitrarily selected in the channel region between the third electrode 53A and the second electrode 52A, and the resistances at the three positions are denoted by resistances R1, R2, and R3. Immediately after the transition to the stress state, the depletion layer extends from the first electrode 51A toward the second electrode 52A. As a result, the number of carriers (electrons) becomes smaller toward the side of the first electrode 51A. Accordingly, the relation between the resistances R1, R2, and R3 are R1>R2>R3.

In the stress state, the higher electric potential is applied to the second electrode 52A than that of the third electrode 53A. The relation between the resistances R1, R2, and R3 are R1>R2>R3. As a result, the voltage drop from the second electrode 52A to the third electrode 53A in the channel region becomes steeper toward the side of the third electrode 53A.

Here, in the semiconductor device 101, there is no conductor 61 between the third electrode 53A and the second electrode 52A. In the semiconductor device 101, the potential of the insulation layer 40 between the third electrode 53A and the second electrode 52A is in a floating state. Accordingly, the potential distribution of the insulation layer 40 of the semiconductor device 101 is apt to reflect that of the channel region.

The potential distribution along the line P-Q in the semiconductor device 101 is expressed, for example, by a curve 101 in FIG. 2A. The curve 101, reflecting the potential distribution of the channel region, forms an upward convex fashion between the third electrode 53A and the second electrode 52A, and becomes steeper toward the third electrode 53A side.

On the other hand, the semiconductor device 1 includes the conductor 61 (the conductive regions 61a to 61d) between the third electrode 53A (gate) and the second electrode 52A (drain). In such the structure, the potential distribution of the insulation layer 40 is apt to reflect the potentials of the conductive regions 61a, 61b, 61c, and 61d in the conductor 61 rather than the potential distribution of the channel region. Each potential of the conductive regions 61a, 61b, 61c, and 61d is affected by the third electrode 53A and the second electrode 52A to which the conductor 61 is connected. Therefore, each potential of the conductive regions 61a, 61b, 61c, and 61d is fit between the potentials of the third electrode 53A and the second electrode 52A. Accordingly, the potentials of the conductive region 61a, the conductive region 61b, the conductive region 61c, and the conductive region 61d become higher in the order.

As a result, the potential distribution along the line P-Q in the semiconductor device 1 is expressed as a curve 1 in FIG. 2A, for example. The curve 1 is lower than the curve 101 between the third electrode 53A and the second electrode 52A.

The 2DEG is apt to enter the insulation layer 40 of the semiconductor device 101, which has a higher potential than the semiconductor device 1. In other words, 2DEG is more trapped by the interface states existing at the interface between the second semiconductor layer 22 and the gate insulation film 30 in the semiconductor device 101, or defects existing in the gate insulation film 30 than in the semiconductor device 1. The electric field generated by the trapped electrons depletes the 2DEG in the channel region, increasing the on-state resistance between the first electrode 51A and the second electrode 52A. When positive fixed charge exists in the insulation layer 40, the current collapse is apt to be occurred.

On the other hand, the potential along the line P-Q in the semiconductor device 1 is lower than that in the semiconductor device 101. Accordingly, the current collapse is less likely to occur in the semiconductor device 1, than in the semiconductor device 101. As a result, in the semiconductor device 1, increase of the on-state resistance between the first electrode 51A and the second electrode 52A is suppressed more than in the semiconductor device 101. In addition, when the positive fixed charge exists in the insulation layer 40 in the semiconductor device 1, the potential of the insulation layer reflects those of the conductive regions 61a to 61d. The semiconductor device 1 can more reliably suppress the current collapse than the semiconductor device 101.

In the semiconductor device 1, the conductive regions 61a to 61d are arranged in the direction from the third electrode 53A toward the second electrode 52A. By adjusting each interval, width, and height of the conductive regions 61a to 61d, the potential distribution of the insulation layer 40 in the direction from the third electrode 53A toward the second electrode 52A can be adjusted as appropriate to obtain a desired distribution.

When influences of the second electrode 52A toward the side of the second electrode 52A increase in the potential distribution of the insulation layer 40, for example, the widths of the conductive regions on the side of the second electrode 52A can be made wider, or the heights of the conductive regions on the second electrode 52A side can be made higher. When influences of the third electrode 53A toward the side of the third electrode 53A increase in the potential distribution of the insulation layer 40, the widths of the conductive regions on the side of the third electrode 53A can be made wider, or the heights of the conductive regions on the third electrode 53A side can be made higher.

When the conductor 61 has a spiral pattern illustrated in FIG. 1B, the lengths of the conductive regions increase toward the side of the second electrode 52A, and the resistances thereof increase toward the side of the second electrode 52A. In such the case, the widths of the conductive regions can be increased, or the heights thereof can be increased, toward the side of the second electrode 52A. In such a manner, the resistances of the conductive regions 61a to 61d are almost equal to one another.

Figure 3:
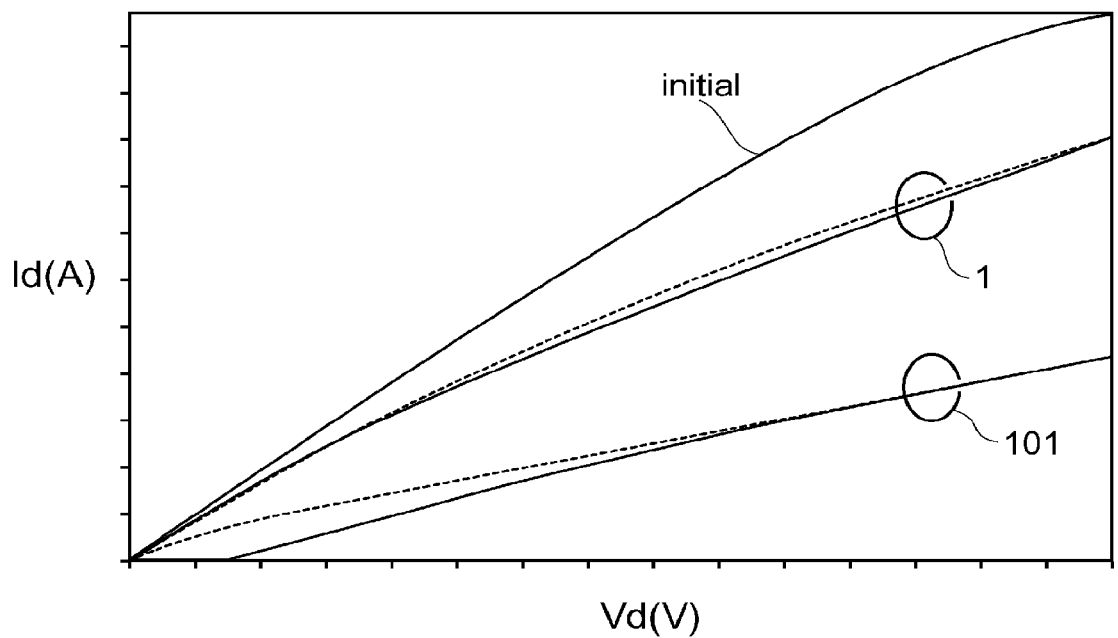
FIG. 3 is a graph illustrating other characteristics of the semiconductor device according to the first embodiment.

FIG. 3 is a graph illustrating other characteristics of the semiconductor device according to the first embodiment.

In FIG. 3, the horizontal axis represents voltage (drain voltage Vd) applied between the first electrode 51A and the second electrode 52A, and the vertical axis represents current (drain current Id) flowing between the first electrode 51A and the second electrode 52A.

The initial state (initial) illustrated in FIG. 3 is, for example, a current-voltage curve when no stress is applied to the semiconductor device. The symbol 1 represents current-voltage curves of the semiconductor device 1. The solid line represents a current-voltage curve immediately after stress application, and the broken line represents a current-voltage curve one second after the stress application. The symbol 101 represents current-voltage curves of the semiconductor device 101. The solid line represents a current-voltage curve immediately after stress application, and the broken line represents a current-voltage curve one second after the stress application.

As illustrated in FIG. 3, when the same voltage as in the initial state is applied to the semiconductor devices 1 and 101, the currents of both semiconductor devices 1 and 101 become lower than the initial currents. The stress application may cause the current collapse and thereby increases the on-state resistances from the initial resistances in the semiconductor devices 1 and 101.

The current of the semiconductor device 1 is larger than that of the semiconductor device 101. As shown in the semiconductor device 1, providing the conductor 61 (the conductive regions 61a to 61d) between the third electrode 53A and the second electrode 52A suppresses the increase of the potential of the insulation layer 40, which suppresses the current collapse and in turn suppresses the increase of the on-state resistance.

The currents indicated by the broken lines are higher than the currents indicated by the solid lines in both the semiconductor devices 1 and 101. The result above may be because the current collapse is relieved about one second after the stress application.

Figure 4A:
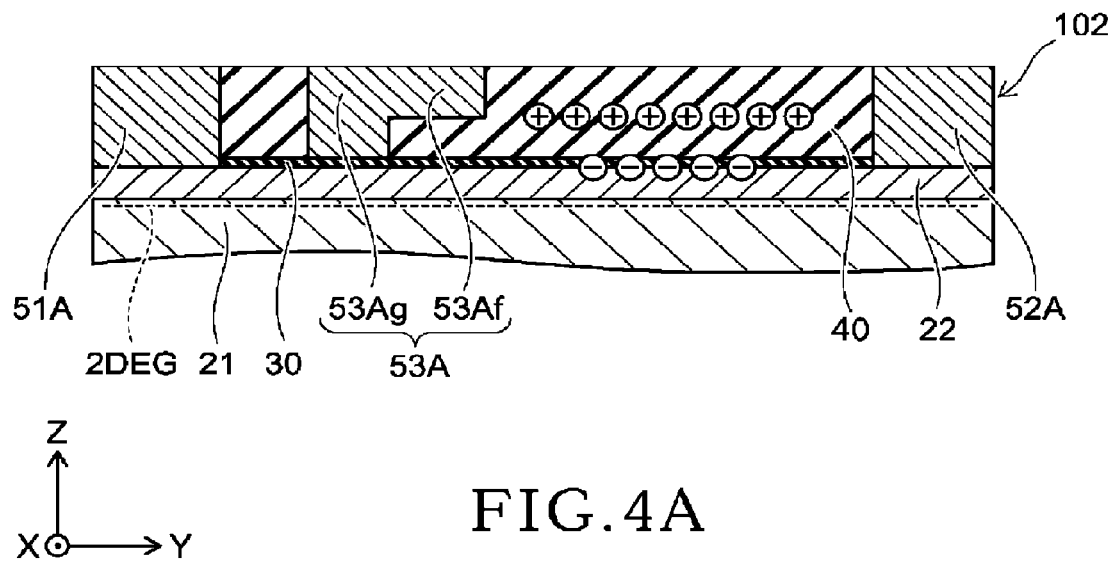
FIGS. 4A and 4B are schematic cross-sectional views of semiconductor devices according to a second reference and a third reference, respectively.
Figure 4B:
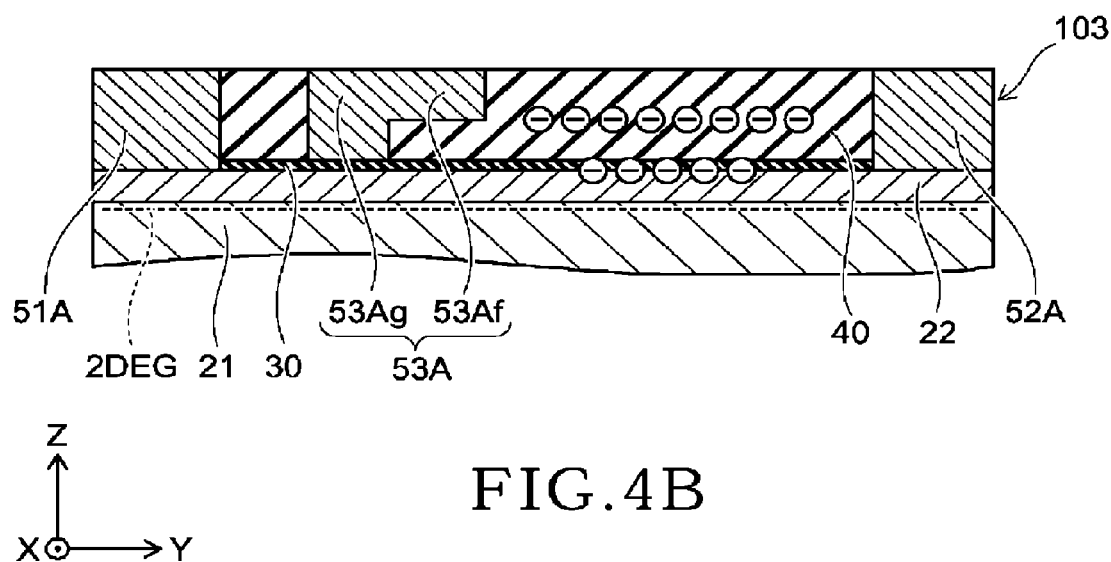

FIGS. 4A and 4B illustrate another reference other than the first reference example. FIG. 4A is a schematic cross-sectional view of a semiconductor device according to a second reference. FIG. 4B is a schematic cross-sectional view of a semiconductor device according to a third reference.

In a semiconductor device 102 illustrated in FIG. 4A, an insulation layer 40 has positive electric charges between a third electrode 53A and a second electrode 52A. In such the structure, after 2DEG is trapped by the insulation layer 40, electric charges of the trapped 2DEG can be cancelled by the positive electric charges.

The semiconductor device 102 has a structure in which 2DEG is apt to be trapped by the insulation layer 40 at stress application because the insulation layer 40 has the positive electric charges permanently. Accordingly, the on-state resistance increases.

On the other hand, in a semiconductor device 103 illustrated in FIG. 4B, an insulation layer 40 has negative electric charges between a third electrode 53A and a second electrode 52A. In such the structure, the infusion of the 2DEG into the insulation layer 40 can be suppressed.

Since the insulation layer 40 permanently has negative electrical charges in the semiconductor device 103, the 2DEG immediately under the insulation layer 40 having negative electrical charges leaves a channel region at stress application, and the on-state resistance increases.

As described on, both the second and third references are not an appropriate structure in terms of reduction of the on-state resistance.

Second Embodiment

Figure 5:
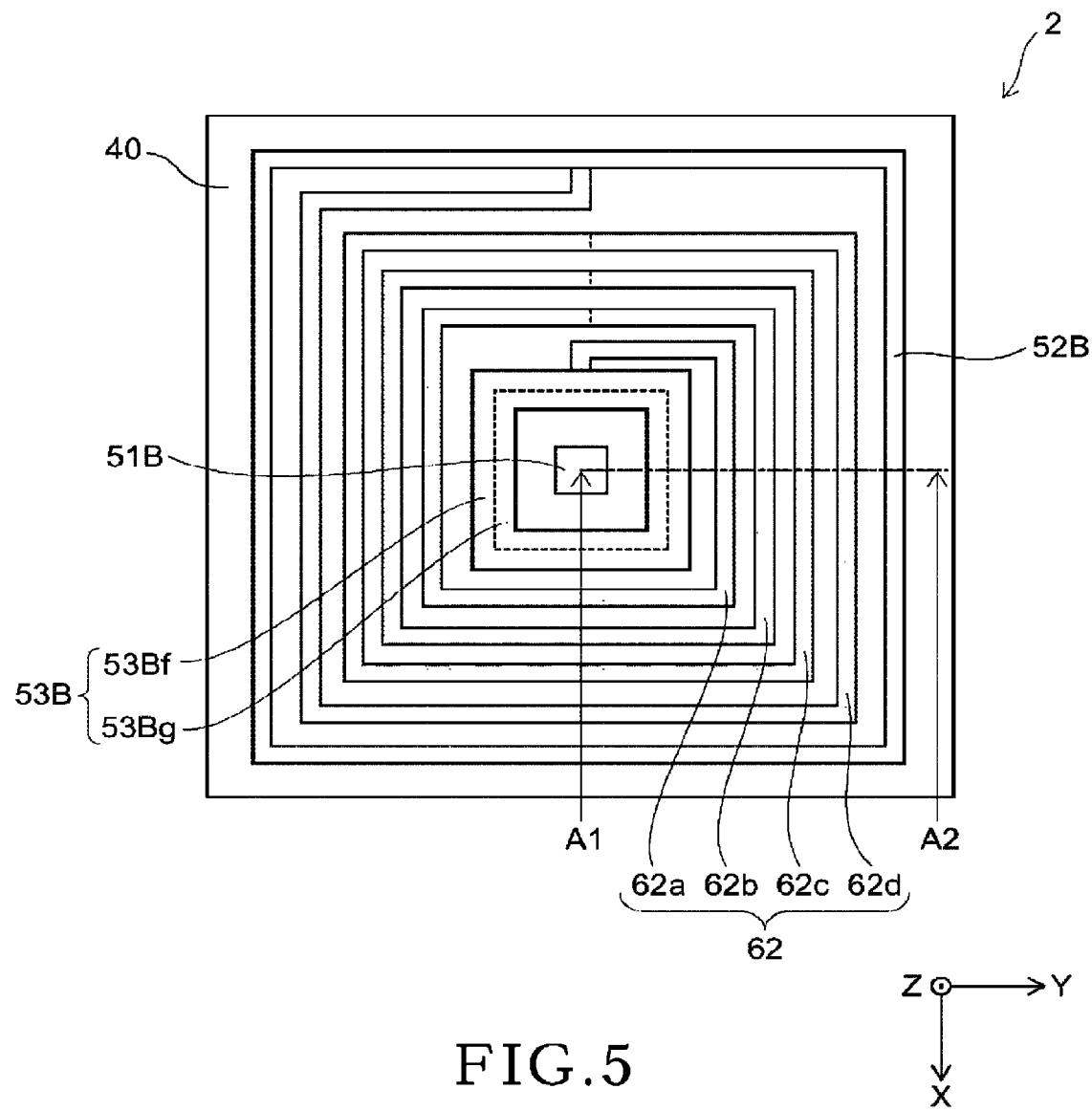
FIG. 5 is a schematic top view illustrating a semiconductor device according to a second embodiment.

FIG. 5 is a schematic top view illustrating a semiconductor device according to a second embodiment.

In a semiconductor device 2, the outer shapes of a first electrode 51B, a second electrode 52B, and a third electrode 53B (a gate electrode 53Bg, a gate field plate electrode 53Bf) in the XY plane are, for example, rectangular shapes. A conductor 62 is arranged between the third electrode 53B and the second electrode 52B. The conductor 62 includes a plurality of conductive regions 62a, 62b, 62c, and 62d.

In the semiconductor device 1, the circular conductive regions 61a to 61d are arranged between the third electrode 53A and the second electrode 52A in a spiral fashion. On the other hand, in the semiconductor device 2, the rectangular conductive regions 62a to 62d are arranged between the third electrode 53B and the second electrode 52B in a spiral fashion. A cross-sectional structure taken along line A1-A2 of the semiconductor device 2 is almost the same as that of the semiconductor device 1. The same effect as in the first embodiment can be obtained also in the second embodiment.

Third Embodiment

Figure 6:
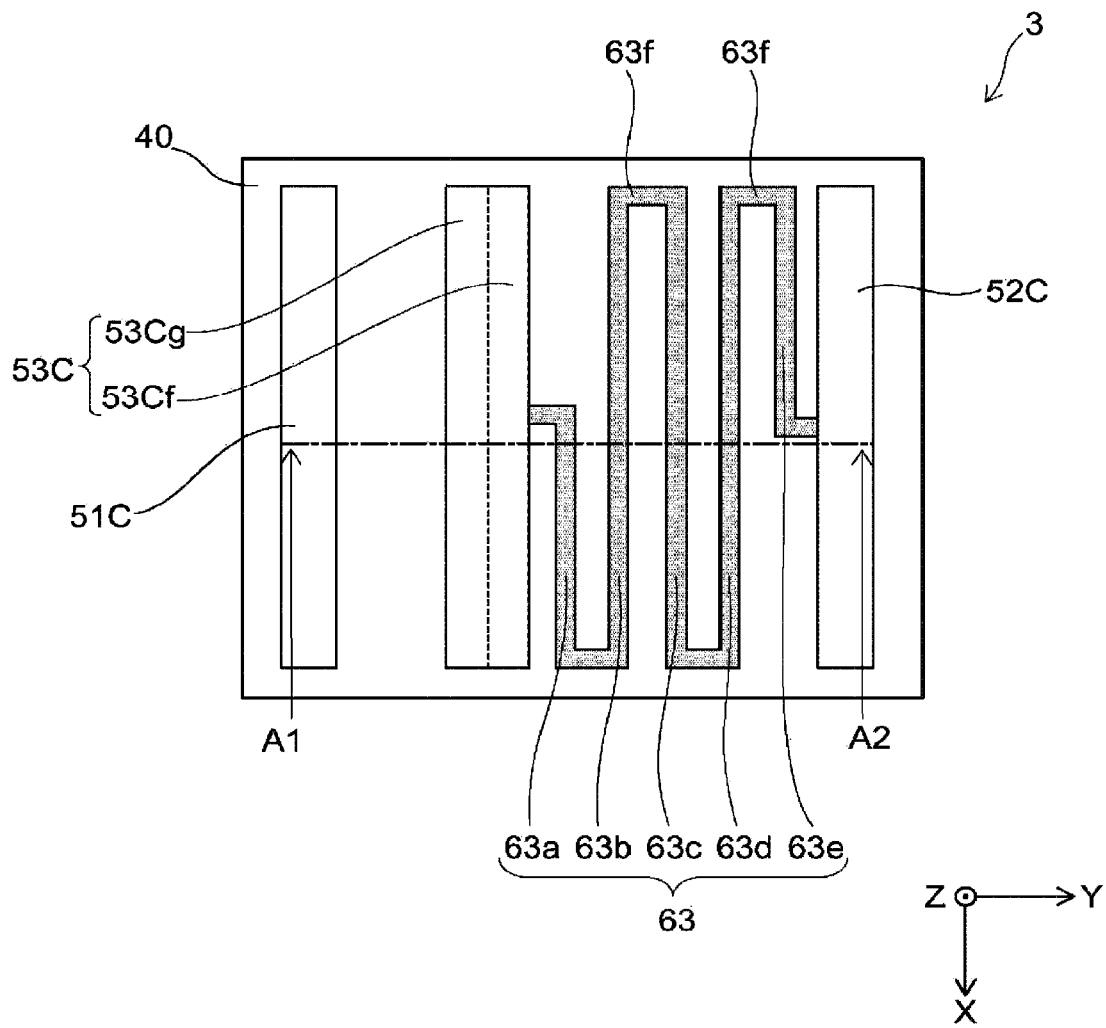
FIG. 6 is a schematic top view illustrating a semiconductor device according to a third embodiment.

FIG. 6 is a schematic top view illustrating a semiconductor device according to a third embodiment.

In a semiconductor device 3, the shapes of a first electrode 51C, a second electrode 52C, and a third electrode 53C (a gate electrode 53Cg, a gate field plate electrode 53Cf) in the XY plane are, for example, rectangular shapes. A conductor 63 is arranged between the third electrode 53C and the second electrode 52C. The conductor 63 includes a plurality of conductive regions 63a, 63b, 63c, 63d, and 63e.

In the semiconductor device 3, the first electrode 51C, the second electrode 52C, the third electrode 53C, and each of the conductive regions 63a to 63e extend in a second direction (the X direction, for example) intersecting a first direction being a direction from the first electrode 51C toward the second electrode 52C. The conductive regions 63a to 63e are connected to one another with connecting regions 63f. The connecting regions 63f extend in the Y direction. Every adjacent two of the conductive regions 63a to 63e are connected to each other with the connecting region 63f. The conductive regions 63a to 63e are connected in series. The total length of the conductive regions 63a to 63e connected in series is longer than the distance between the second electrode 52C and the third electrode 53C.

The cross-sectional structure taken along line A1-A2 of the semiconductor device 3 is almost the same as that of the semiconductor device 1. The same effect as in the first embodiment can be obtained also in the third embodiment.

Fourth Embodiment

Figure 7A:
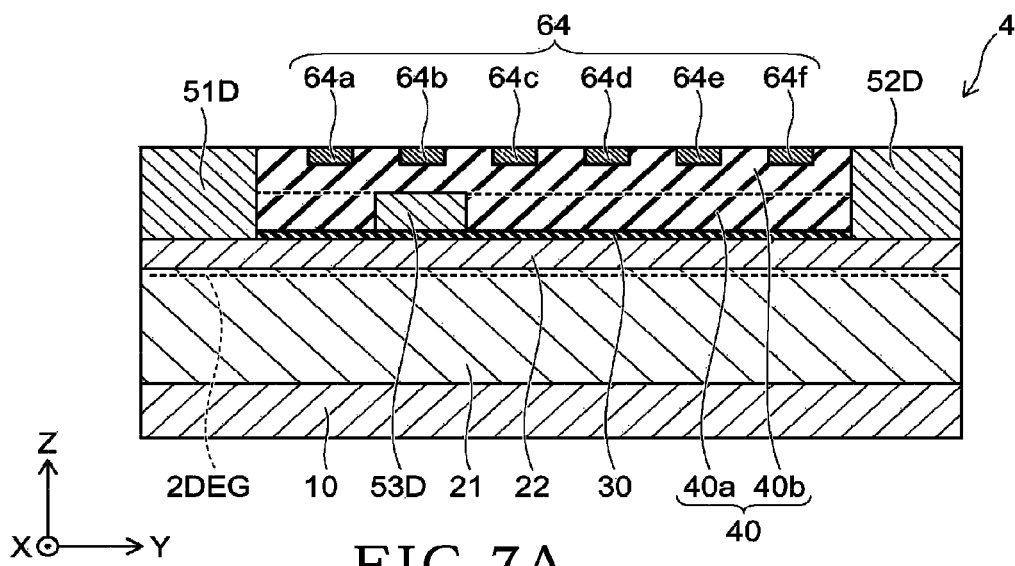
FIGS. 7A and 7B are a schematic cross-sectional view and a schematic top view illustrating a semiconductor device according to a fourth embodiment, respectively.
Figure 7B:
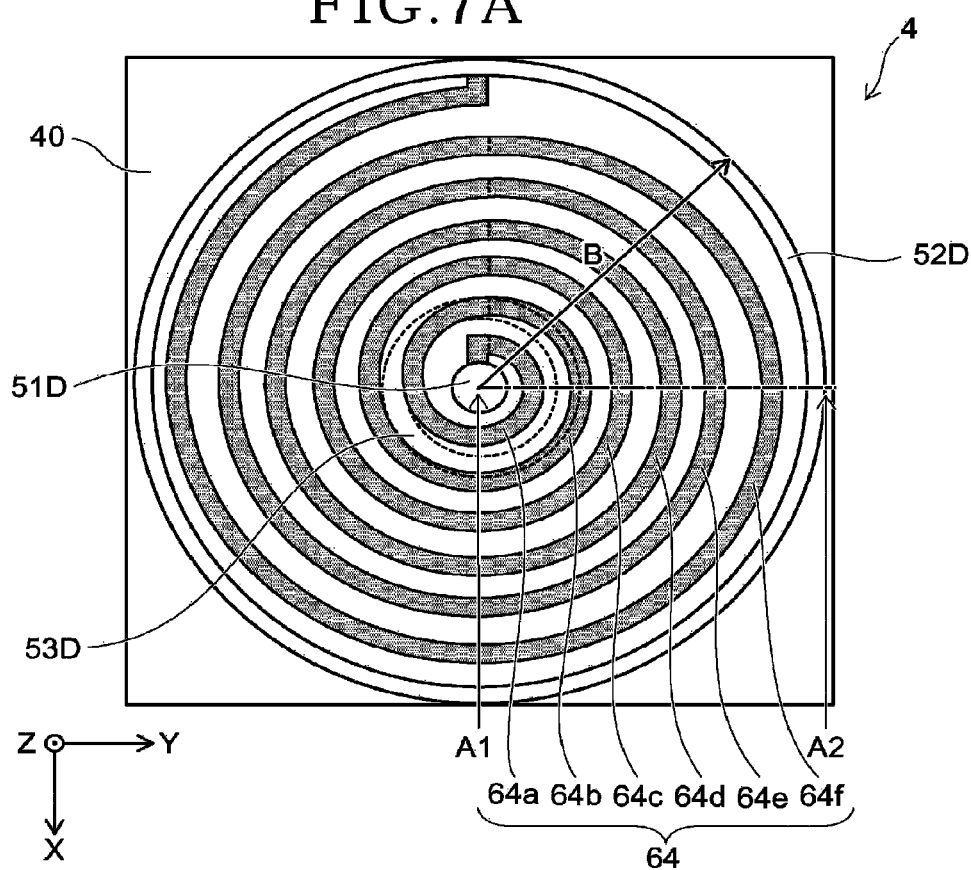

FIG. 7A is a schematic cross-sectional view illustrating a semiconductor device according to a fourth embodiment. FIG. 7B is a schematic top view illustrating the semiconductor device according to the fourth embodiment. FIG. 7A illustrates the cross section taken along line A1-A2 of FIG. 7B.

In a semiconductor device 4, the shapes of a first electrode 51D, a second electrode 52D, and a third electrode 53D in the XY plane are, for example, circular shapes. The first electrode 51D is, for example, surrounded by the third electrode 53D. The third electrode 53D is surrounded by the second electrode 52D.

In the semiconductor device 4, a conductor 64 is provided between the first electrode 51D and the second electrode 52D. The conductor 64 is provided within an insulation layer 40. The conductor 64 electrically connects the first electrode 51D and the second electrode 52D to each other.

The conductor 64 includes a plurality of conductive regions 64a, 64b, 64c, 64d, 64e, and 64f. The conductive regions 64a to 64f are arranged in the direction of the arrow B, for example. The conductive regions 64a to 64f are electrically connected to one another. The conductive regions 64a to 64f are connected in series, for example. The total length of the conductive regions 64a to 64f connected in series is longer than the distance between the first electrode 51D and the second electrode 52C.

The conductive region 64b of the conductive regions 64a to 64f, is provided on the third electrode 53D with the insulation layer 40 in between. The first electrode 51D is surrounded by the conductive regions 64a to 64f. The conductive region 64a is surrounded by the conductive region 64b. The conductive region 64b is surrounded by the conductive region 64c. The conductive region 64c is surrounded by the conductive region 64d. The conductive region 64d is surrounded by the conductive region 64e. The conductive region 64e is surrounded by the conductive region 64f. The conductive regions 64a to 64f connected in series are arranged above a second semiconductor layer 22 in a spiral fashion.

In the semiconductor device 4, the conductor 64 (the conductive regions 64a to 64f) is provided between the first electrode 51D and the second electrode 52D. The conductor 64 (the conductive regions 64a to 64f) is electrically connected to the first electrode 51D and the second electrode 52D. When no stress is applied in the semiconductor device 4, no current flows between the first electrode 51D and the second electrode 52D because the first electrode 51D and the second electrode 52D have the same voltage (0 V, for example).

In the above structure, the potential of the insulation layer 40 reflects that of the conductor 64 (the conductive regions 64a to 64f) at stress application. Accordingly, the increase of the potential of the insulation layer 40 is suppressed. As a result, also in the fourth embodiment, the current collapse is suppressed, and the increase of the on-state resistance is suppressed.

The pattern shape of the conductor 64 is not limited to the structure illustrated in FIG. 7B. Each of the conductive regions 64a to 64f may be, for example, a rectangular shape as in the semiconductor device 2.

Fifth Embodiment

Figure 8:
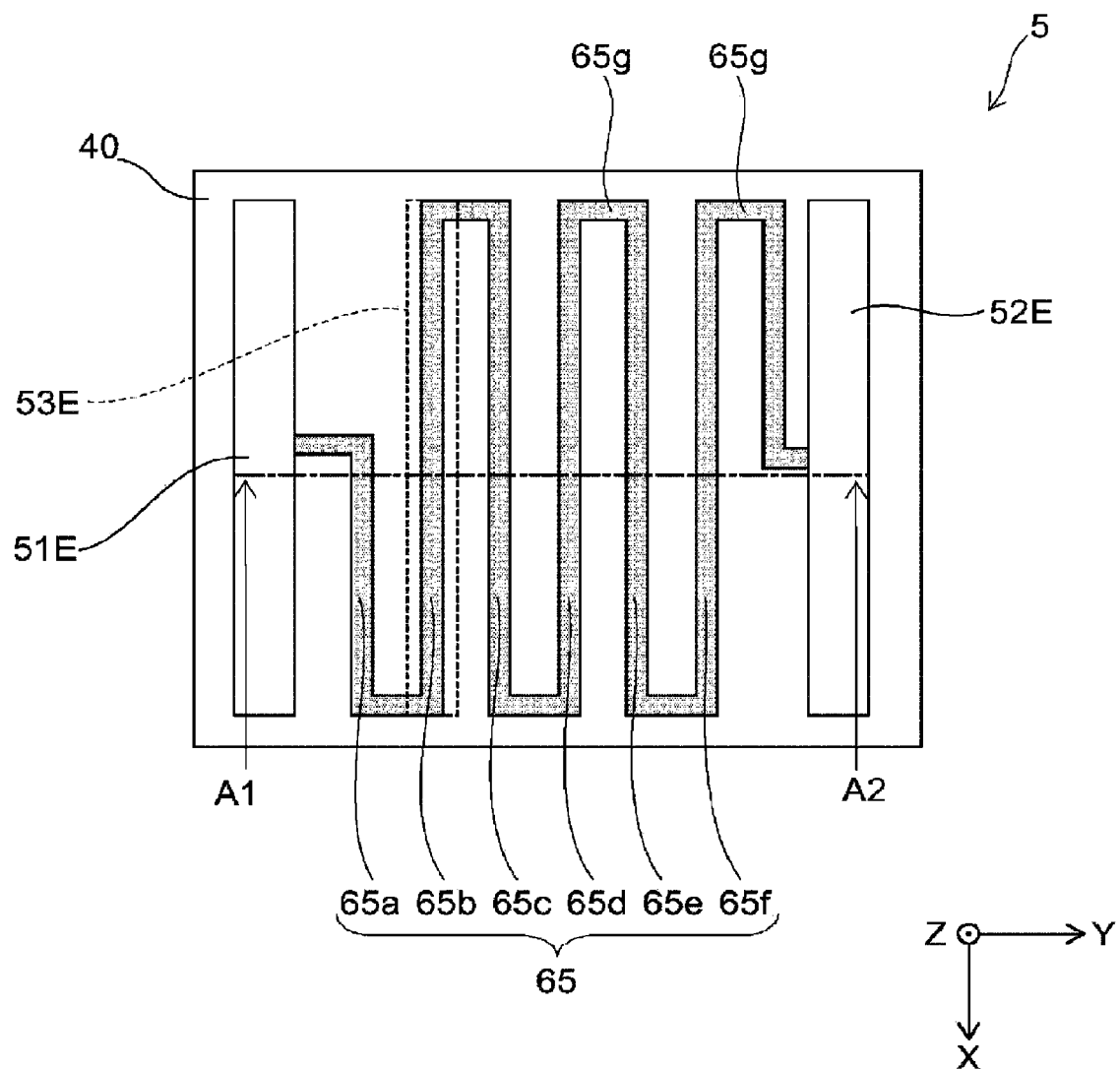
FIG. 8 is a schematic top view illustrating a semiconductor device according to a fifth embodiment.

FIG. 8 is a schematic top view illustrating a semiconductor device according to a fifth embodiment.

In a semiconductor device 5, the shapes of a first electrode 51E, a second electrode 52E, and a third electrode 53E in the XY plane are, for example, rectangular shapes. A conductor 65 is arranged between the third electrode 53E and the second electrode 52E. The conductor 65 includes a plurality of conductive regions 65a, 65b, 65c, 65d, 65e, and 65f.

In the semiconductor device 5, each of the first electrode 51E, the second electrode 52E, the third electrode 53E, and the conductive regions 65a to 65f extend in a second direction (the X direction, for example) intersecting a first direction from the first electrode 51E toward the second electrode 52E. The conductive regions 65a to 65f are connected to one another with connecting regions 65g. The connecting regions 65g extend in the Y direction. Every adjacent two of the conductive regions 65a to 65f are connected to each other with the connecting region 65g. Each of the conductive regions 65a to 65f is connected in series. The total length of the conductive regions 65a to 65f connected in series is longer than the distance between the first electrode 51E and the second electrode 52E.

The cross-sectional structure taken along line A1-A2 of the semiconductor device 5 is almost the same as that of the semiconductor device 4. The same effect as in the fourth embodiment can be obtained also in the fifth embodiment.

Sixth Embodiment

Figure 9A:
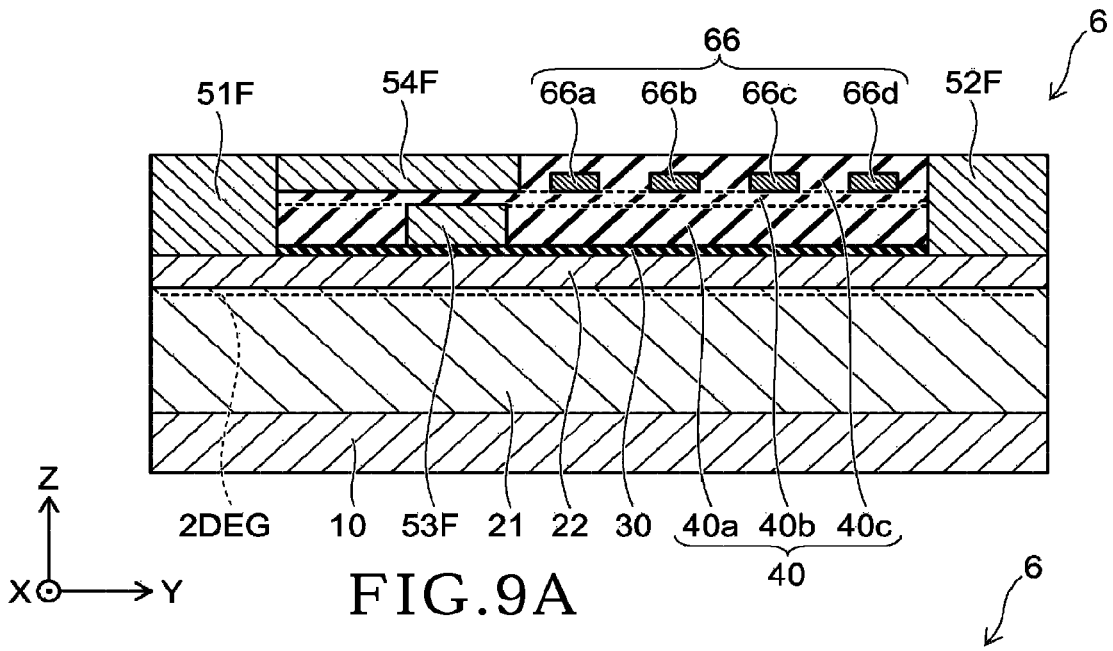
FIGS. 9A and 9B are a schematic cross-sectional view and a schematic top view illustrating a semiconductor device according to a sixth embodiment, respectively.
Figure 9B:
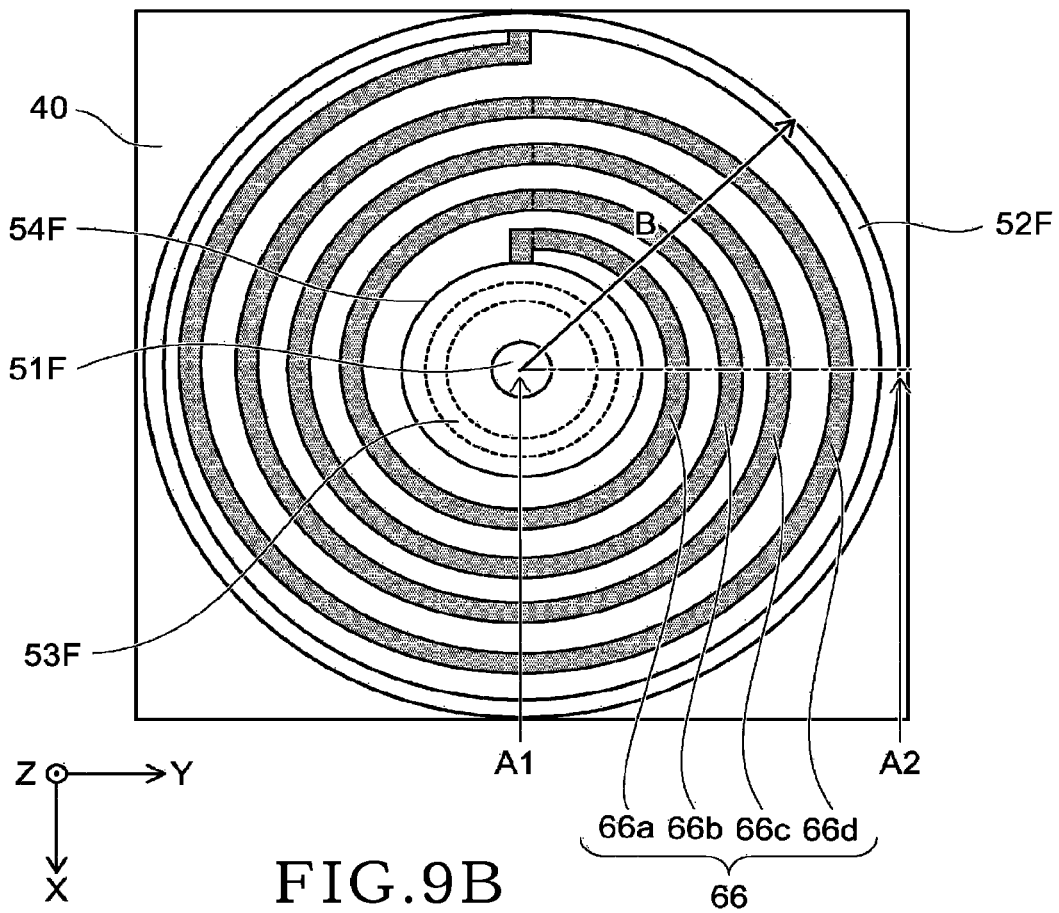

FIG. 9A is a schematic cross-sectional view illustrating a semiconductor device according to a sixth embodiment. FIG. 9B is a schematic top view illustrating the semiconductor device according to the sixth embodiment. FIG. 9A illustrates the cross section taken along line A1-A2 of FIG. 9B.

In a semiconductor device 6, the shapes of a first electrode 51F, a second electrode 52F, and a third electrode 53F in the XY plane are, for example, circular shapes. The first electrode 51F is surrounded by the third electrode 53F. The third electrode 53F is surrounded by the second electrode 52F.

The semiconductor device 6 further includes a fourth electrode 54F. The fourth electrode 54F is a source field plate electrode. The fourth electrode 54F is provided on the second semiconductor layer 22 and the third electrode 53F. The fourth electrode 54F is connected to the first electrode 51F. The shape of the fourth electrode 54F in the XY plane is, for example, a circular shape. The fourth electrode 54F is surrounded by the second electrode 52F.

An insulation layer 40 includes an insulation layer 40a provided above the second semiconductor layer 22, an insulation layer 40b provided on the insulation layer 40a, and an insulation layer 40c provided on the insulation layer 40b. The fourth electrode 54F is provided on the insulation layer 40b. When the insulation layer 40b and the insulation layer 40c are made of the same material, there is almost no boundary between the insulation layer 40b and the insulation layer 40c.

In the semiconductor device 6, a conductor 66 is provided between the fourth electrode 54F and the second electrode 52F. The first electrode 51F is electrically connected to the conductor 66 via the fourth electrode 54F. The conductor 66 is provided within the insulation layer 40. The conductor 66 electrically connects the fourth electrode 54F and the second electrode 52F to each other.

The conductor 66 includes a plurality of conductive regions 66a, 66b, 66c, and 66d. The conductive regions 66a to 66d are arranged in the direction of the arrow B, for example. The conductive regions 66a to 66d are electrically connected to one another. The conductive regions 66a to 66d are connected in series. The total length of the conductive regions 66a to 66d connected in series is longer than the distance between the fourth electrode 54F and the second electrode 52F.

The fourth electrode 54F is surrounded by the conductive regions 66a to 66d. The conductive region 66a is surrounded by the conductive region 66b. The conductive region 66b is surrounded by the conductive region 66c. The conductive region 66c is surrounded by the conductive region 66d. The conductive regions 66a to 66d connected in series are arranged on the second semiconductor layer 22 in a spiral fashion.

In the semiconductor device 6, the conductor 66 (the conductive regions 66a to 66d) is provided between the fourth electrode 54F and the second electrode 52F. The conductor 66 (the conductive regions 66a to 66d) is electrically connected to the fourth electrode 54F and the second electrode 52F.

In the above structure, the potential of the insulation layer 40 reflects that of the conductor 66 (the conductive regions 66a to 66d) at stress application. Accordingly, the increase of the potential of the insulation layer 40 is suppressed. As a result, in the sixth embodiment, the current collapse is suppressed, and the increase of the on-state resistance is suppressed. In the semiconductor device 6, the fourth electrode 54F suppresses the increase of the potential of the insulation layer 40.

The pattern shape of the conductor 66 is not limited to the structure illustrated in FIG. 9B. Each of the conductive regions 66a to 66d may be, for example, a rectangular shape as in the semiconductor device 2.

Seventh Embodiment

Figure 10:
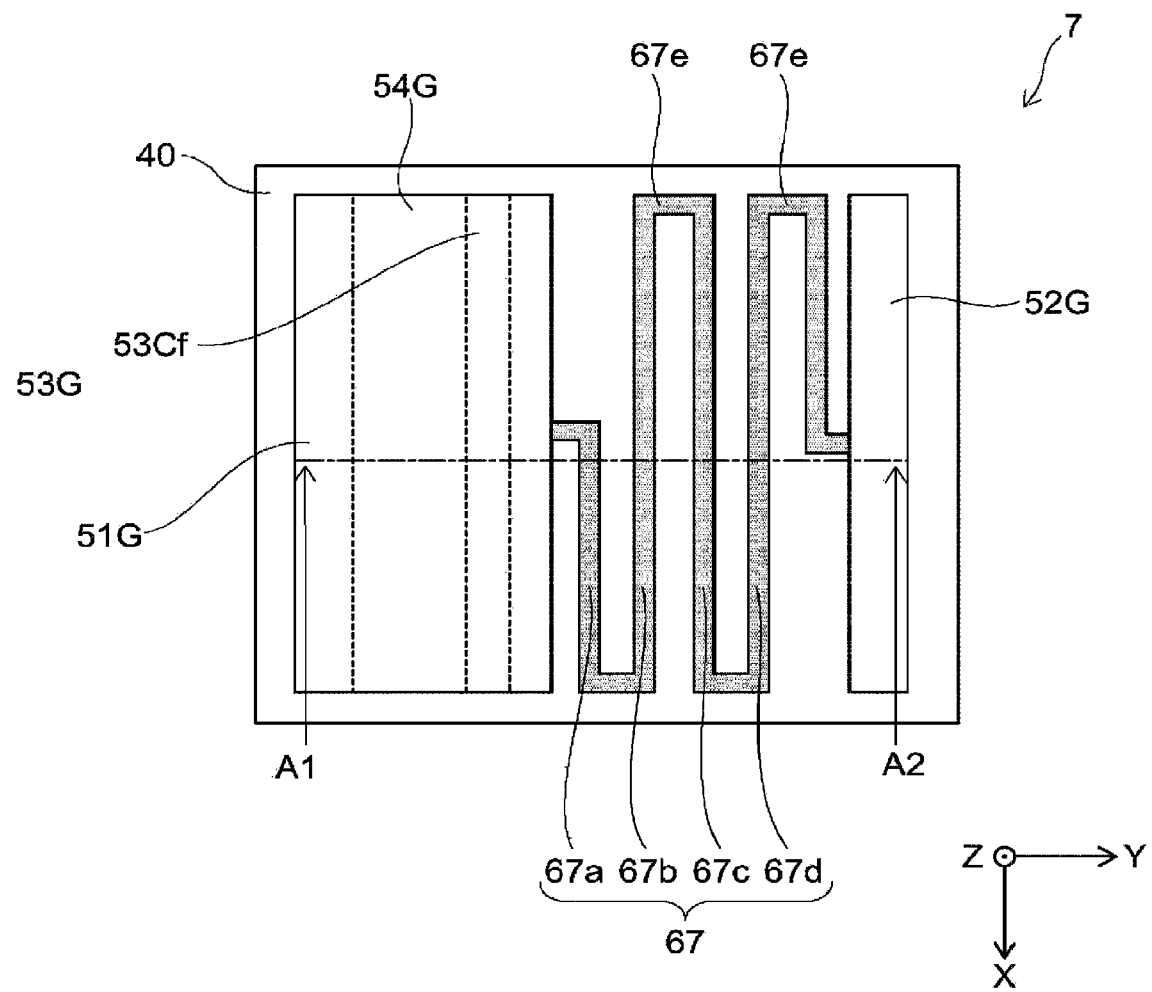
FIG. 10 is a schematic top view illustrating a semiconductor device according to a seventh embodiment.

FIG. 10 is a schematic top view illustrating a semiconductor device according to a seventh embodiment.

In a semiconductor device 7, the shapes of a first electrode 51G, a second electrode 52G, a third electrode 53G, and a fourth electrode 54G in the XY plane are, for example, rectangular shapes. A conductor 67 is arranged between the fourth electrode 54G and the second electrode 52G. The conductor 67 includes a plurality of conductive regions 67a, 67b, 67c, and 67d.

In the semiconductor device 7, each of the first electrode 51G, the second electrode 52G, the third electrode 53G, the fourth electrode 54G, and the conductive regions 67a to 67d extend in a second direction (the X direction, for example) intersecting a first direction from the first electrode 51G toward the second electrode 52G. The conductive regions 67a to 67d are connected to one another with connecting regions 67e. The connecting regions 67e extend in the Y direction. Every adjacent two of the conductive regions 67a to 67d are connected to each other with the connecting region 67e. Each of the conductive regions 67a to 67d is connected in series. The total length of the conductive regions 67a to 67d connected in series is longer than the distance between the first electrode 51G and the second electrode 52G.

The cross-sectional structure taken along line A1-A2 of the semiconductor device 7 is almost the same as that of the semiconductor device 6. The same effect as in the sixth embodiment can be obtained also in the seventh embodiment.

Eighth Embodiment

Processing steps of the semiconductor devices according to the embodiments is described taking the semiconductor device 6 as an example.

Figure 11A:
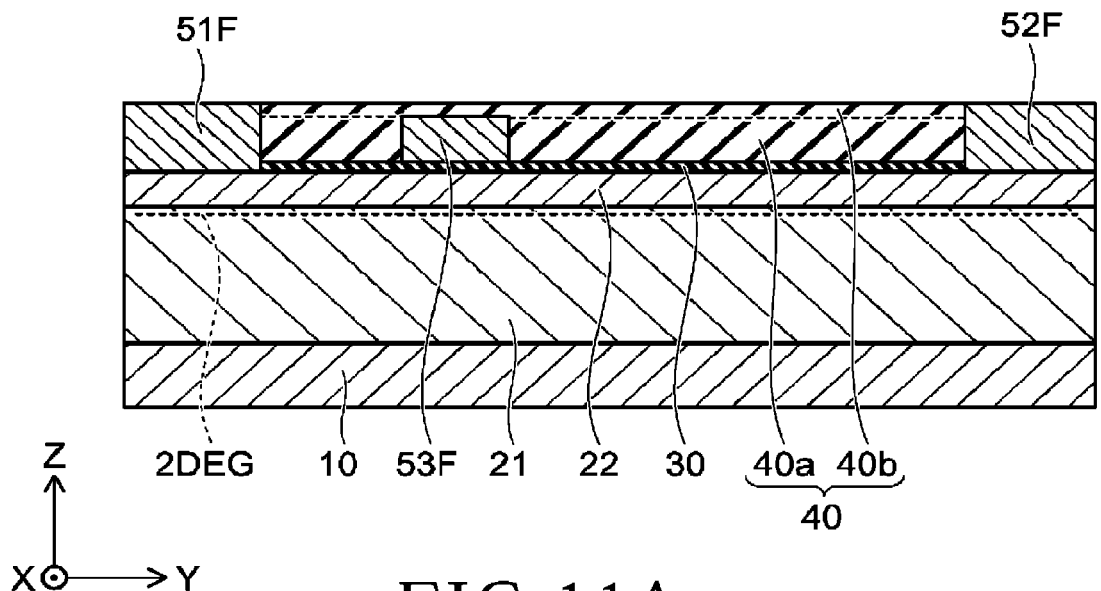
FIGS. 11A and 11B are schematic cross-sectional views illustrating processing steps of the semiconductor device according to the embodiments.
Figure 13A:
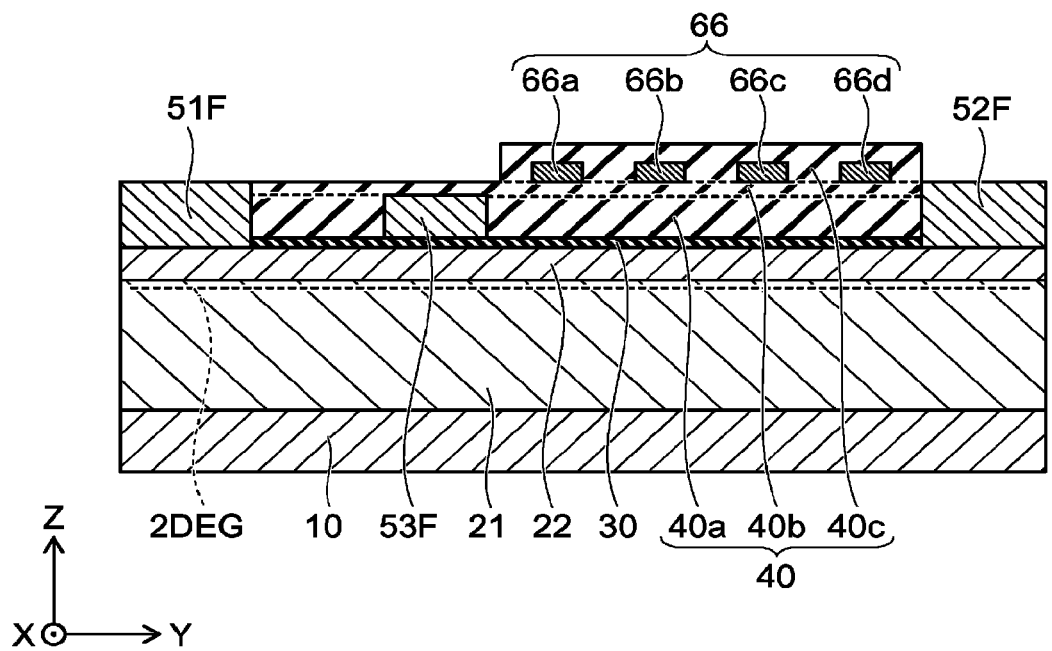
FIGS. 13A and 13B are schematic cross-sectional views illustrating processing steps of the semiconductor device according to the embodiments.
Figure 13B:
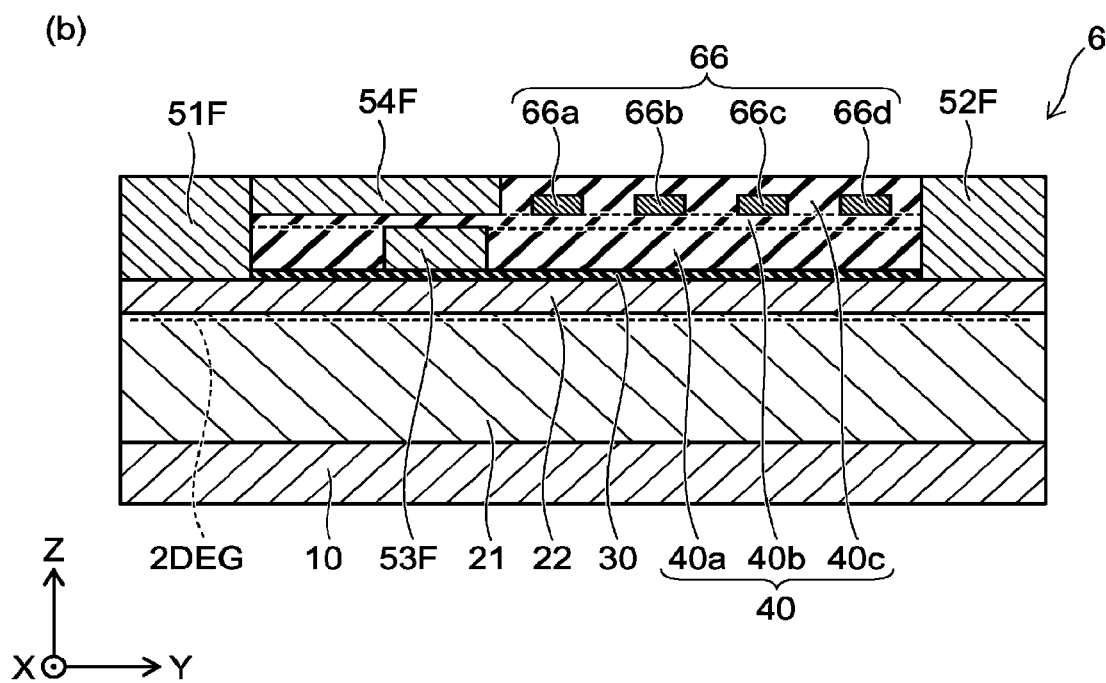

FIGS. 11A and 13B are schematic cross-sectional views illustrating the processing steps of the semiconductor device according to the embodiments.

As illustrated in FIG. 11A, the first semiconductor layer 21 is formed on the substrate 10, for example. The second semiconductor layer 22 is formed on the first semiconductor layer 21. The gate insulation film 30 is formed on the second semiconductor layer 22. The first electrode 51F and the second electrode 52F are formed on the second semiconductor layer 22. The third electrode 53F is formed on the second semiconductor layer 22 with the gate insulation film 30 in between. The insulation layer 40a is formed on the gate insulation film 30, and the insulation layer 40b is formed on the insulation layer 40a and the third electrode 53F.

Figure 11B:
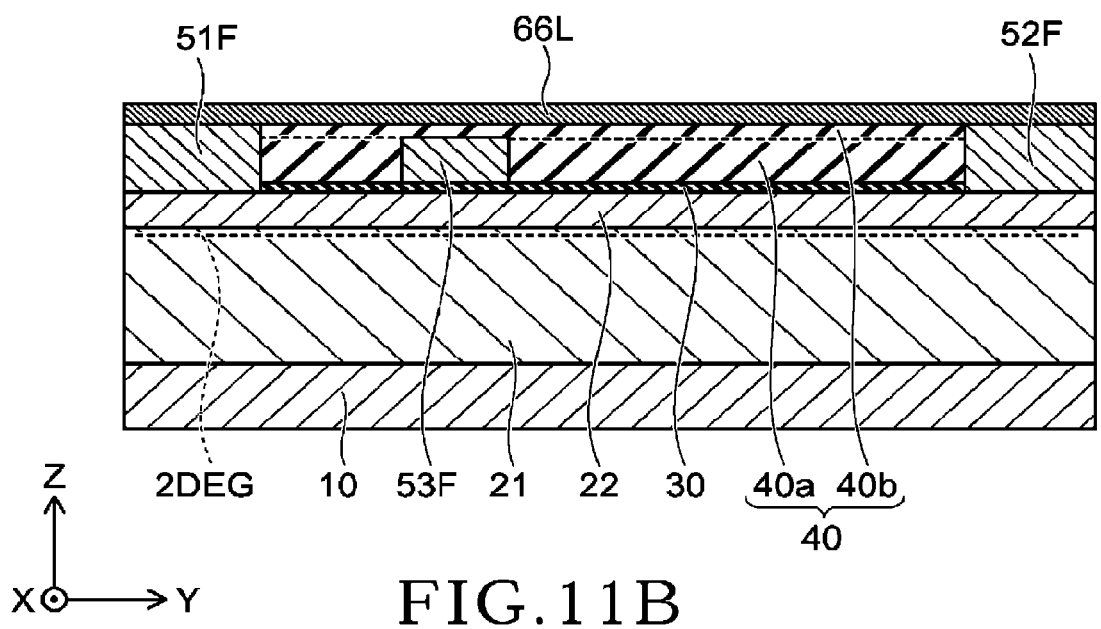
Figure 12A:
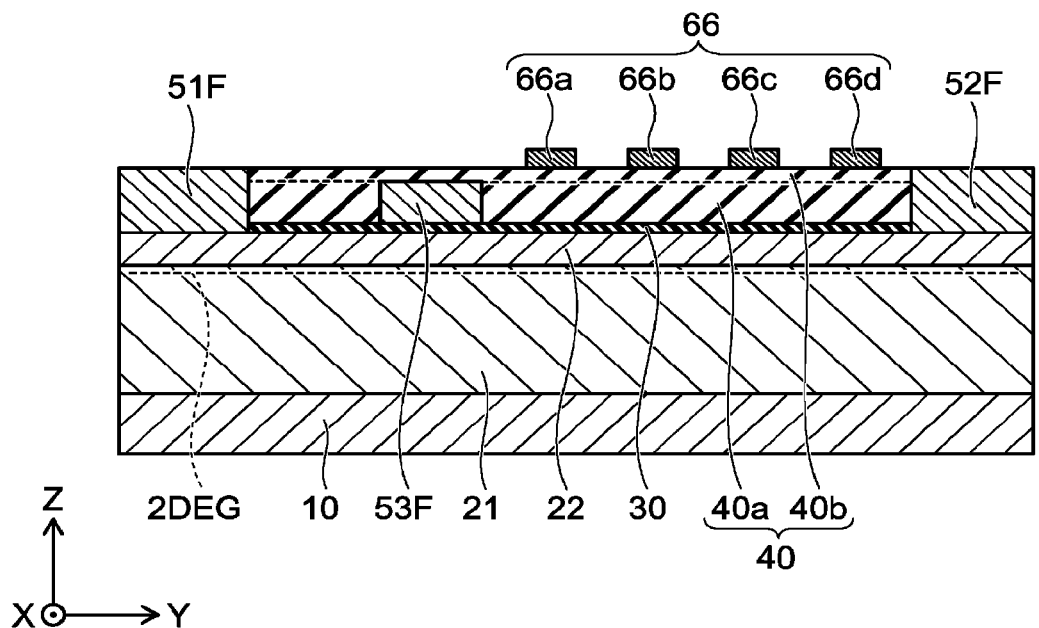
FIGS. 12A and 12B are schematic cross-sectional views illustrating processing steps of the semiconductor device according to the embodiments.

As illustrated in FIG. 11B, a conductive layer 66L is formed on the first electrode 51F, the second electrode 52F, and the insulation layer 40b. The conductive layer 66L is formed, for example, by any of sputtering, chemical vapor deposition (CVD), plating, and the like. The conductive layer 66L is patterned by photolithography and reactive ion etching (RIE). The state after the RIE step is illustrated in FIG. 12A.

When the conductor 66 (the conductive regions 66a to 66d) is viewed from the above, the patterns thereof are shaped in a spiral fashion (FIG. 9B). The interval or the width of each of the conductive regions 66a to 66d can be adjusted as appropriate with patterning the conductive layer 66L.

Figure 12B:
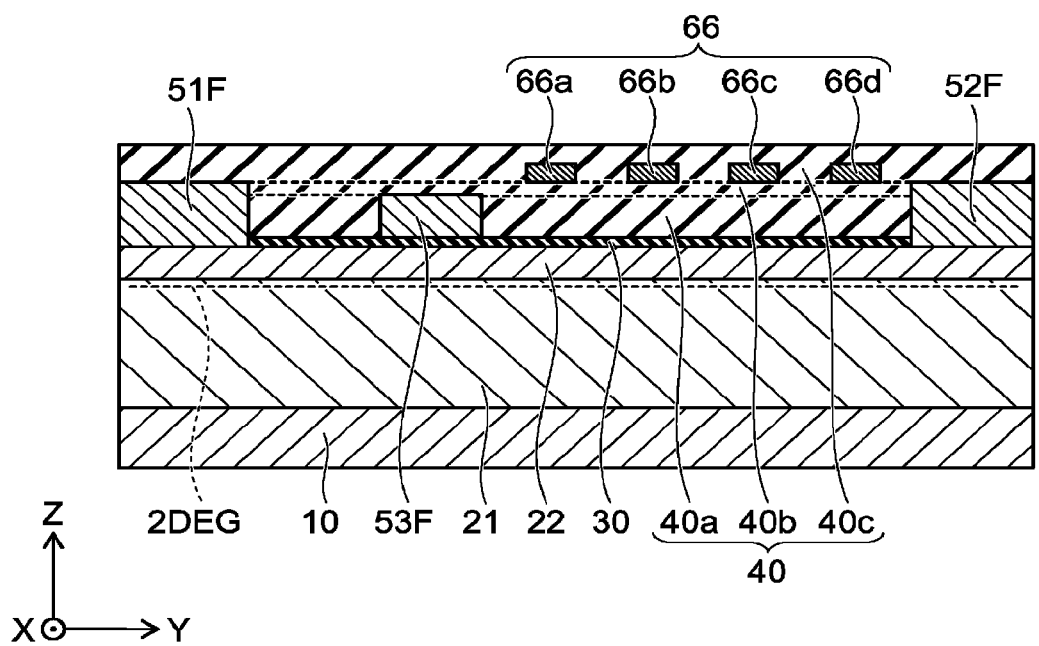

As illustrated in FIG. 12B, the insulation layer 40c is formed on the first electrode 51F, the second electrode 52F, the conductor 66, and the insulation layer 40b.

As illustrated in FIG. 13A, the insulation layer 40c on the first electrode 51F and on the second electrode 52F is removed by photolithography and RIE. The insulation layer 40c on the insulation layer 40b from the first electrode 51F to and over the third electrode 53F is also removed by photolithography and RIE.

As illustrated in FIG. 13B, the first electrode 51F is formed such that the thickness of the first electrode 51F increases. The second electrode 52F is formed such that the thickness of the second electrode 52F increases. The fourth electrode 54F connected to the first electrode 51F is formed on the insulation layer 40b. The conductor 66, when viewed from the above, is electrically connected to the fourth electrode 54F and the second electrode 52F (FIG. 9B). The semiconductor device 6 is formed in the processing steps described above.

In the above embodiments, material included in each of the first electrodes 51A, 51B, 51C, 51D, 51E, 51F, and 51G is the same as one another. Material included in each of the second electrodes 52A, 52B, 52C, 52D, 52E, 52F, and 52G is the same as one another. Material included in each of the third electrodes 53A, 53B, 53C, 53D, 53E, 53F, and 53G is the same as one another. Material included in each of the fourth electrodes 54F and 54G is the same as each other. Material included in each of the conductors 61, 62, 63, 64, 65, 66, and 67, the connecting regions 63f, 65g, and 67e, and the conductive layer 66L is the same as one another.

In the above embodiments, the expression "on" in a description "A is provided on B" is used not only for the case where A is provided on B with A being in contact with B, but also used for the case where A is provided above B with A being out of contact with B. An expression "A is provided on B" is also used for the case where A is positioned below B when A and B are inverted vertically, and for the case where A and B are positioned horizontally side by side. The reason is that even when the orientation of the semiconductor device according to any of the embodiments is changed, the structure of the semiconductor device before and after the orientation change is the same.

Up to this point, the embodiments have been described with reference to the specific examples. The embodiments are not limited to those specific examples. Those obtained by making design changes on these specific examples by those skilled in the art are also included in the scope of the embodiments as long as they include a feature of the embodiments. Each constituent included in the above embodiments, and arrangement, material, condition, shape, size, and the like thereof are not limited to those illustrated and may be changed as appropriate.

In addition, each constituent included in the embodiments described above may be combined as long as it is technically possible. Such combinations are also included in the scope of the embodiments as long as the combinations include a feature of the embodiments. Within the spirit of the embodiments, various changes and modifications can be conceived by those who skilled in the art, and such changes and modifications are also included within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a first nitride semiconductor layer;
   a second nitride semiconductor layer provided on the first nitride semiconductor layer, the second nitride semiconductor layer having a band gap width larger than or equal to a band gap width of the first nitride semiconductor layer;
   a first electrode provided on the second nitride semiconductor layer;
   a second electrode provided on the second nitride semiconductor layer;
   a third electrode provided on the second nitride semiconductor layer and between the first electrode and the second electrode;
   an insulation layer provided on the second nitride semiconductor layer and between the first electrode and the second electrode; and
   a conductor provided within the insulation layer between the second electrode and the third electrode and connecting the second electrode and the third electrode to each other,
   wherein
   the conductor includes a plurality of conductive regions arranged in a first direction which is a direction from the first electrode toward the second electrode,
   the conductive regions are electrically connected to one another,
   the conductor is provided between the second electrode and the third electrode,
   the conductive regions are connected to one another in series,
   the first electrode is surrounded by the third electrode,
   the third electrode is surrounded by the second electrode, and
   the third electrode is surrounded by the conductive regions.

2. The semiconductor device of claim 1, further comprising
   a fourth electrode, wherein
   the fourth electrode is provided on the second nitride semiconductor layer and the third electrode,
   the fourth electrode is connected to the first electrode, and
   the first electrode is electrically connected to the conductor via the fourth electrode.

3. The semiconductor device of claim 2, wherein
   the conductor is provided between the fourth electrode and the second electrode,
   the conductive regions are connected to one another in series,
   the first electrode is surrounded by the third electrode,
   the third electrode and the fourth electrode are surrounded by the second electrode, and
   the fourth electrode is surrounded by the conductive regions.

4. The semiconductor device of claim 3, wherein the conductive regions are arranged above the second nitride semiconductor layer in a spiral fashion.

5. The semiconductor device of claim 2, wherein
   the conductor is provided between the fourth electrode and the second electrode,
   the conductive regions are connected to one another in series, and
   each of the first electrode, the second electrode, the third electrode, the fourth electrode, and the conductive regions extends in a second direction intersecting the first direction.

6. The semiconductor device of claim 1, wherein the conductive regions are arranged above the second nitride semiconductor layer in a spiral fashion.

7. The semiconductor device of claim 1, wherein the conductor includes polycrystalline silicon or oxide film.

8. The semiconductor device of claim 1, wherein the first nitride semiconductor layer includes $Al_xGa_{1-x}N$ ($0 \leq X \leq 1$), and the second nitride semiconductor layer includes $Al_yGa_{1-y}N$ ($0 \leq Y \leq 1$, $X<Y$).

9. The semiconductor device of claim 1, wherein
   the first electrode is a source electrode,
   the second electrode is a drain electrode, and
   the third electrode includes a gate electrode and a gate field plate electrode.

10. A semiconductor device comprising:
    a first nitride semiconductor layer;
    a second nitride semiconductor layer provided on the first nitride semiconductor layer, the second nitride semiconductor layer having a band gap width larger than or equal to a band gap width of the first nitride semiconductor layer;
    a first electrode provided on the second nitride semiconductor layer;
    a second electrode provided on the second nitride semiconductor layer;
    a third electrode provided on the second nitride semiconductor layer and between the first electrode and the second electrode;
    an insulation layer provided on the second nitride semiconductor layer and between the first electrode and the second electrode; and a conductor provided within the insulation layer between the first electrode and the second electrode and connecting the first electrode and the second electrode to each other wherein the conductor includes a plurality of conductive regions arranged in a first direction which is a direction from the first electrode toward the second electrode, the conductive regions is electrically connected to one another, the conductor is provided between the first electrode and the second electrode, the conductive regions are connected to one another in series, the first electrode is surrounded by the third electrode, the third electrode is surrounded by the second electrode, and the third electrode is surrounded by the conductive regions.

11. The semiconductor device of claim 10, wherein the conductive regions are arranged above the second nitride semiconductor layer in a spiral fashion.

12. The semiconductor device of claim 10, further comprising a fourth electrode, wherein the fourth electrode is provided on the second nitride semiconductor layer and the third electrode, the fourth electrode is connected to the first electrode, and the first electrode is electrically connected to the conductor via the fourth electrode.

13. The semiconductor device of claim 12, wherein the conductor is provided between the fourth electrode and the second electrode, the conductive regions are connected to one another in series, the first electrode is surrounded by the third electrode, the third electrode and the fourth electrode are surrounded by the second electrode, and the fourth electrode is surrounded by the conductive regions.

14. The semiconductor device of claim 12, wherein the conductor is provided between the fourth electrode and the second electrode, the conductive regions are connected to one another in series, and each of the first electrode, the second electrode, the third electrode, the fourth electrode, and the conductive regions extends in a second direction intersecting the first direction.

\* \* \* \* \*